United States Patent
Benaissa et al.

(10) Patent No.: US 8,716,827 B2
(45) Date of Patent: May 6, 2014

(54) DIFFUSION RESISTOR WITH REDUCED VOLTAGE COEFFICIENT OF RESISTANCE AND INCREASED BREAKDOWN VOLTAGE USING CMOS WELLS

(75) Inventors: Kamel Benaissa, Garland, TX (US); Amitava Chatterjee, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/609,818

(22) Filed: Sep. 11, 2012

(65) Prior Publication Data

US 2014/0070361 A1 Mar. 13, 2014

(51) Int. Cl.
*H01L 21/70* (2006.01)
*H01L 29/00* (2006.01)

(52) U.S. Cl.
USPC .......................... 257/506; 257/536; 257/537

(58) Field of Classification Search
USPC .......................... 257/506, 536, 537
See application file for complete search history.

(56) References Cited

U.S. PATENT DOCUMENTS

| | | | |
|---|---|---|---|
| 4,954,766 A | 9/1990 | Ishikawa et al. | |
| 6,127,957 A | 10/2000 | Fattaruso et al. | |
| 7,039,888 B2 | 5/2006 | Steinmann et al. | |
| 2002/0084494 A1 | 7/2002 | Benaissa et al. | |
| 2008/0237656 A1* | 10/2008 | Williams et al. | 257/262 |
| 2008/0237782 A1* | 10/2008 | Williams et al. | 257/513 |
| 2010/0140731 A1* | 6/2010 | Lee | 257/440 |
| 2012/0108020 A1 | 5/2012 | Baldwin et al. | |
| 2012/0181619 A1* | 7/2012 | Yang et al. | 257/370 |

* cited by examiner

*Primary Examiner* — Ngan Ngo
(74) *Attorney, Agent, or Firm* — Jacqueline J. Garner; Wade J. Brady, III; Frederick J. Telecky, Jr.

(57) ABSTRACT

Integrated circuits and manufacturing methods are presented for creating diffusion resistors (101, 103) in which the diffusion resistor well is spaced from oppositely doped wells to mitigate diffusion resistor well depletion under high biasing so as to provide reduced voltage coefficient of resistivity and increased breakdown voltage for high-voltage applications.

10 Claims, 8 Drawing Sheets

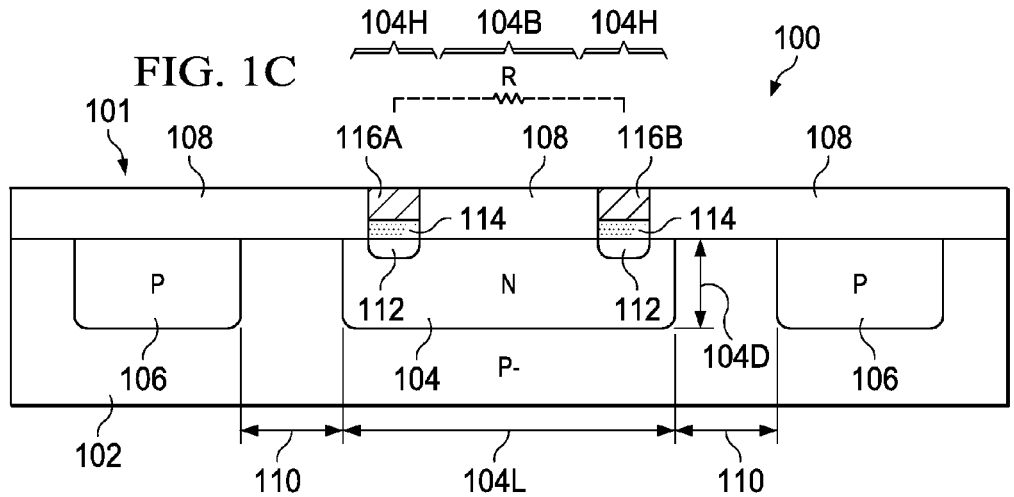
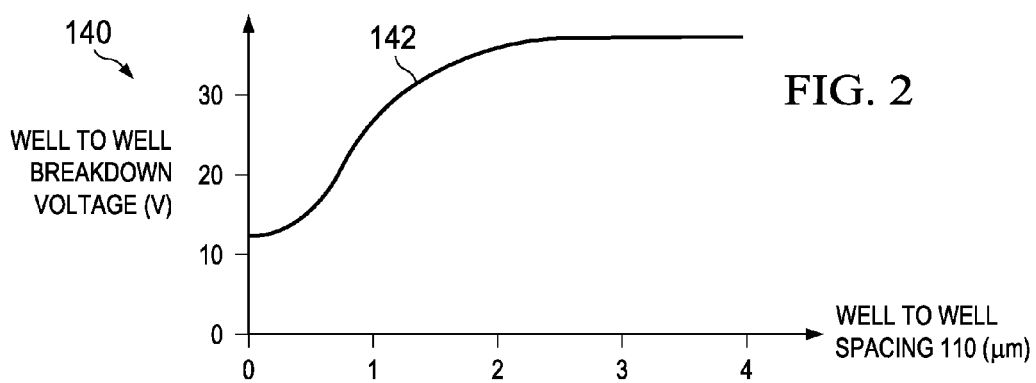
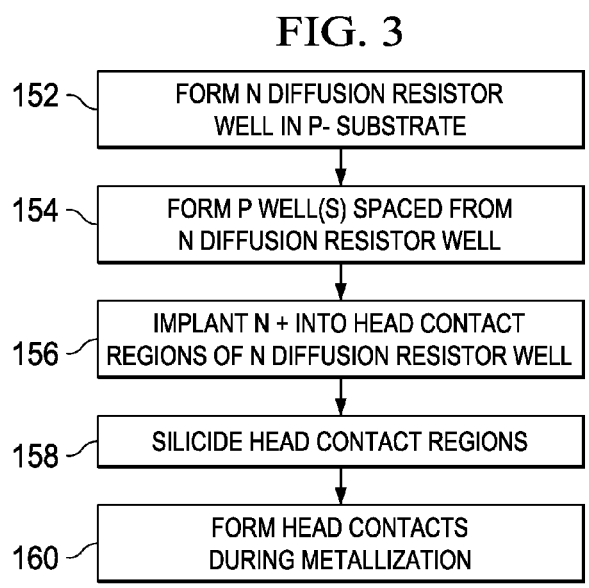

DIFFUSION RESISTOR WITH REDUCED VOLTAGE COEFFICIENT OF RESISTANCE AND INCREASED BREAKDOWN VOLTAGE USING CMOS WELLS

FIELD OF THE INVENTION

The present disclosure relates to the field of integrated circuits (ICs), and more particularly to diffusion resistors and methods for making the same.

BACKGROUND OF THE INVENTION

Diffusion resistors or well resistors are commonly implemented as nwell structures in P− substrate twin-well bulk CMOS technology surrounded by an adjacent pwell. These diffusion resistors, however, suffer from relatively low breakdown voltage (BV) and high voltage coefficient of resistivity (VCR) by which conventional diffusion resistors are typically unsuitable for high voltage applications. Alternative resistor structures may be used, such as silicided polysilicon resistors or silicide blocked polysilicon resistors. Polysilicon has a relatively low sheet resistance and these resistor structures are therefore larger than corresponding diffusion resistors for a given desired resistance value. For instance, typical diffusions may have a resistivity of about 500 ohms per square, whereas polysilicon is about 20 ohms per square. For high resistance values, moreover, narrow polysilicon line widths are prone to process variations. In addition, silicide blocked poly resistors require an extra mask to block silicide, leading to higher manufacturing cost. Furthermore, polysilicon can only accommodate a certain amount of current density. Another alternative is use of lightly doped high-voltage nwell (HVNWELL) resistors, in which dopant concentration is lower than normal CMOS nwells, in some cases by a factor of 10. The lighter doping provides high breakdown voltage capabilities. However, the lighter well doping of HVNWELLs results in higher VCR than more heavily doped diffusion resistors. Accordingly, improved integrated circuits and fabrication techniques are needed for providing integral resistors.

SUMMARY OF THE INVENTION

Various aspects of the present disclosure are now summarized for compliance with 37 CFR §1.73 to facilitate a basic understanding of the disclosure by briefly indicating the nature and substance of the disclosure, wherein this summary is not an extensive overview of the disclosure, and is intended neither to identify certain elements of the disclosure, nor to delineate the scope thereof. Rather, the primary purpose of this summary is to present some concepts of the disclosure in a simplified form prior to the more detailed description that is presented hereinafter, and this summary is submitted with the understanding that it will not be used to interpret or limit the scope or meaning of the claims.

The inventors have appreciated that the nwell-to-pwell junction of a conventional nwell diffusion resistor has a relatively low breakdown voltage, and therefore is typically unsuitable for circuit applications with relatively high signal and bias voltages. Moreover, the inventors have recognized that conventional nwell diffusion resistors have high voltage coefficient of resistivity caused by lateral extension of the depletion region from the well-well junction into the body portion of the resistor well with increasing reverse bias. Depletion may also occur in conventional diffusion resistors at the bottom of the nwell above the P− substrate.

The present disclosure presents integrated circuit embodiments with diffusion resistors in which the body region of the resistor well is spaced away from the outlying well structure, for example, by using a pwell implant mask patterned to block the pwell implants in a region adjacent to the diffusion resistor nwell. The dopant concentration in the intervening well-free region of the p-type substrate is much lower than that of the CMOS wells, and the region adjacent to the nwell resistor body remains very lightly doped relative to the doping density in the resistor. The inventors have appreciated that the spacing distance between the nwell implants and the pwell implants in such embodiments can be engineered such that most of the potential drop across the p-n junction occurs in the lightly doped well-free region outside the resistor. This reduces the amount of depletion within the resistor well thereby reducing the voltage coefficient of resistivity, and also increases the breakdown voltage.

Integrated circuits are provided, including a semiconductor substrate with a first implanted well of one conductivity type having a body region along with first and second head regions disposed at opposite ends of the body region. A second implanted well of a different conductivity type is provided, which is laterally spaced from the first well to provide a well-free portion of the semiconductor substrate extending laterally between the second well and the body region of the first well. The wells are each formed as a plurality of successively deeper implanted regions, with a deepest region having a range defining a corresponding well depth that is equal to or greater than the depth of shallow trench isolation structures formed in the substrate. The second well in certain embodiments faces at least one lateral side of the body region of the first well, and surrounds two or more, or even all, lateral sides of the first well in other embodiments. The well-free portion has a lower dopant concentration than the second well and the first well body region, and contact structures are individually connected to the head regions of the first well. In certain embodiments, the substrate and the second well are of one conductivity type, and the first well is of a different conductivity type, for example, where the diffusion resistor well is an nwell formed in a P type substrate, with a pwell spaced from and encircling the nwell. In other embodiments, the substrate and the diffusion resistor well are of the same conductivity type, such as a pwell formed in a P substrate. A deep well, such as a deep nwell may be provided beneath and spaced from the first well, where the second well extend vertically between the upper surface of the substrate and the deep well.

Methods are provided for forming an integrated circuit, including providing a semiconductor substrate, forming a first well by a plurality of successively deeper implantations, with a deepest implantation defining a first range as deep or deeper than an isolation structure depth, forming at least one second well by a plurality of successively deeper second implantations of another conductivity type spaced from the first well in the substrate, the formation of the second well including a deepest implantation that defines a second range with a depth equal to or greater than the isolation structure depth, and forming contact structures connected to spaced first and second head regions of the first well, where the implantations are used to concurrently formed wells in a dual well CMOS process. In certain embodiments, the first well is formed by implantation using a first mask that covers the well-free portion of the substrate, and the second well is formed by implanting dopants while covering the well-free portion of the substrate with a second implant mask. In other embodiments, a deep well is formed to a depth greater than that of the first well, and the second well is formed between the upper surface of the substrate and at least a portion of the deep well.

DESCRIPTION OF THE VIEWS OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which:

FIGS. 1A-1C are partial sectional end elevation, top plan, and side elevation views, respectively, illustrating an integrated circuit with an nwell diffusion resistor structure laterally surrounded by a spaced pwell with an intervening well-free region of a P− semiconductor substrate;

FIG. 2 is a graph illustrating diffusion resistor breakdown voltage as a function of well-to-well spacing in the integrated circuit of FIGS. 1A-1C;

FIG. 3 is a flow diagram illustrating a method for fabricating an integrated circuit with an nwell diffusion resistor of FIGS. 1A-1C;

DETAILED DESCRIPTION

Figure 1A:
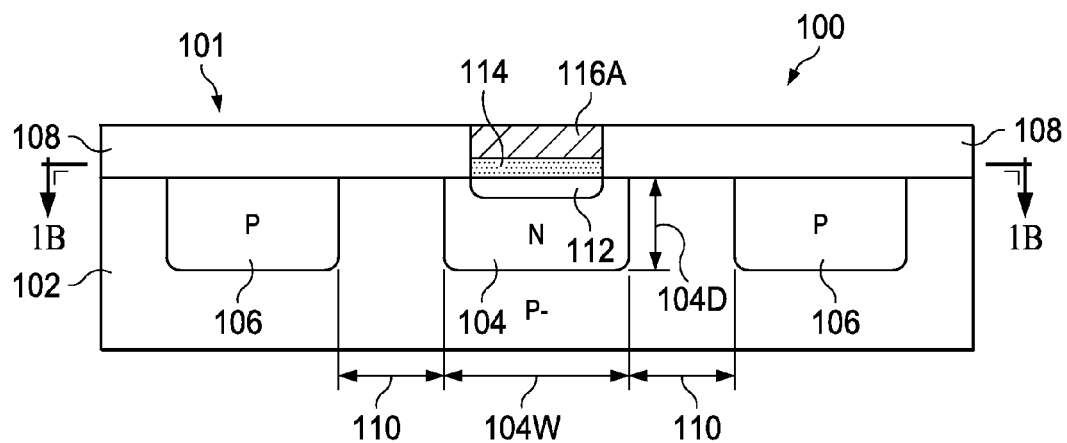

One or more embodiments or implementations are hereinafter described in conjunction with the drawings, wherein like reference numerals are used to refer to like or similar elements throughout. The various features are not necessarily drawn to scale and are provided merely to illustrate the various concepts of the present disclosure. Several aspects of the invention are described below with reference to example applications for illustration. It should be understood that numerous specific details, relationships, and methods are set forth to provide a full understanding of the disclosed concepts. One skilled in the relevant art, however, will readily recognize that these concepts can be practiced without one or more of the specific details or with other methods. In other instances, well-known structures or operations are not shown in detail to avoid obscuring the disclosed apparatus and processes, wherein the present disclosure is not limited by the illustrated ordering of acts or events, as some acts may occur in different orders and/or concurrently with other acts or events. Furthermore, not all illustrated acts or events are required to implement a methodology in accordance with the present disclosure.

Figure 1B:
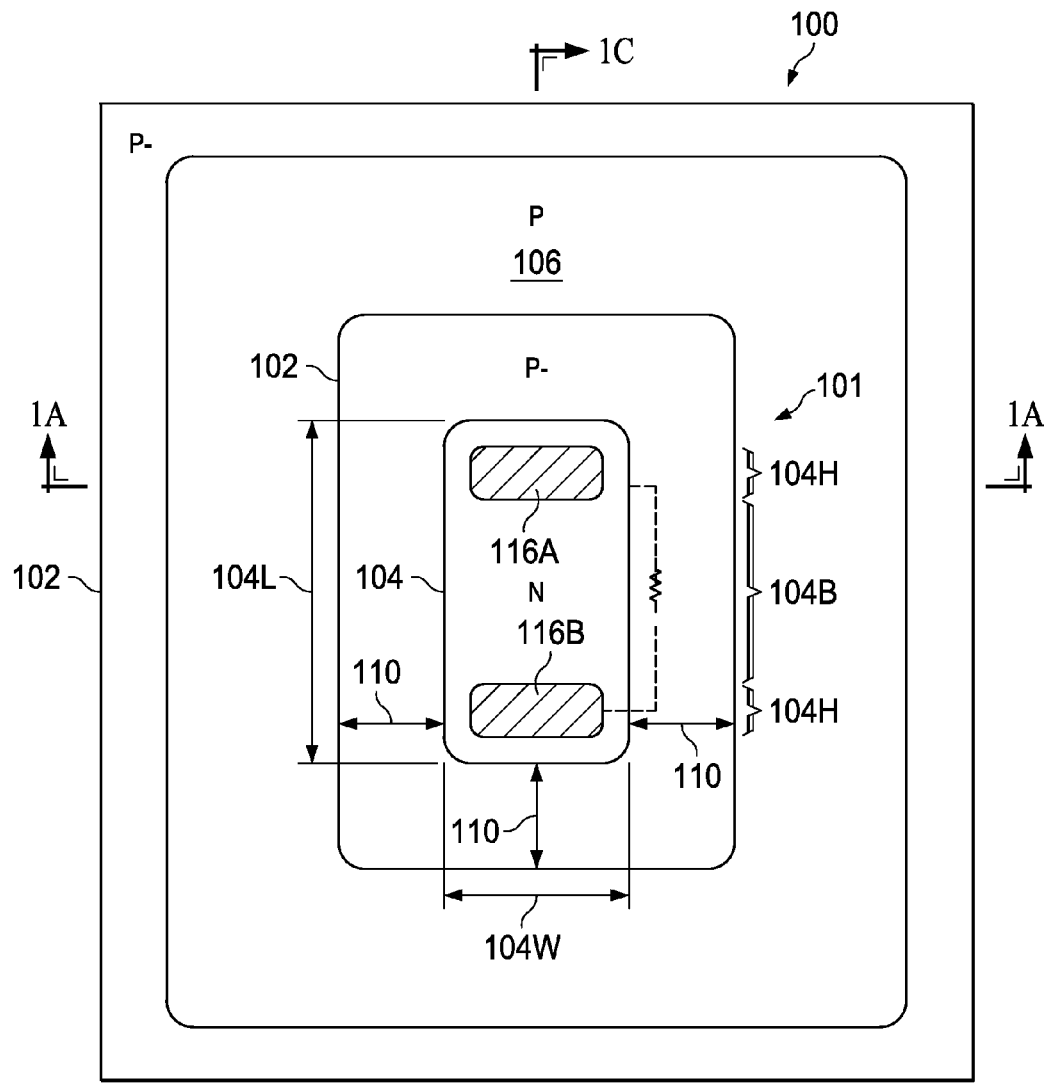

FIGS. 1A-1C illustrate an integrated circuit 100 with an nwell diffusion resistor 101 formed in a P− substrate 102. The substrate 102 may be a single crystal silicon wafer in certain embodiments, and various other structures may be formed on and/or in the substrate 102 as part of a CMOS fabrication process, wherein details of these are omitted to avoid scaring the various aspects of the present disclosure. FIG. 1B illustrates a top plan view showing the diffusion resistor 101 in the substrate 102, wherein FIG. 1A shows a sectional end elevation view taken along line 1A-1A in FIG. 1B, and FIG. 1C shows a sectional side elevation view taken along line 1C-1C in FIG. 1B. As best seen in FIG. 1C, the diffusion resistor 101 in this example includes an elongated nwell 104 formed to a depth 104D in an upper surface of the substrate 102, defining an nwell length 104L and a width 104W (FIG. 1A). As seen in FIGS. 1B and 1C, moreover, the nwell 104 has a body region 104B as well as longitudinally spaced head regions 104H disposed at opposite longitudinal ends of the body region 104B, with contact structures 114, 116 individually connected to the head regions 104H. In the illustrated example, portions of the head regions 104H include N+ implanted regions, over which silicide 114 is formed for connection to contacts 116, although any suitable low impedance electrical contact structure can be used providing connection to the first and second head regions 104H of the well 104 to provide connections 116A and 116B for the resulting diffusion resistor 101. As seen in FIGS. 1A and 1C, moreover, the illustrated IC 100 includes a thick oxide layer 108, and one or more overlying metallization layers and other structures (not shown) may be provided as part of the integrated circuit 100.

The nwell dimensions 104D, 104L and 104W in a given implementation may be tailored to provide a desired nominal target resistance value R, and the depth dimension 104D is standardized according to a dual well or twin well CMOS fabrication process, whereby the nwell 104 is formed concurrently with formation of other nwells (not shown) in fabrication of the integrated circuit 100. The well 104 includes a plurality of successively deeper first implanted regions with a deepest one of the first implanted regions having a first range defining a first well depth 104D at which a maximum implanted dopant concentration occurs. The first well depth 104D, moreover, is greater than or equal to an isolation depth of isolation structures (not shown), such as shallow trench isolation (STI) isolation structures formed in the semiconductor substrate 102. In one example, the nwell well 104 is formed to a depth of about 1.5 μm or less, such as about 1-1.5 μm in one embodiment, or about 0.7-0.8 μm in another embodiment, although other depths 104D are possible which are at least as deep as the isolation structures formed elsewhere in the integrated circuit 100. For embodiments in which the nwell depth 104D is set according to a standard CMOS process, a given desired resistance value R can be achieved by designing the nwell length 104L and width 104W.

The integrated circuit 100 of FIGS. 1A-1C further includes a pwell 106, which generally laterally encircles the nwell 104, as best seen in FIG. 1B. In certain embodiments, the second well 106 is formed to be laterally proximate to or facing at least one lateral side of the body region 104B of the first well 104. In other embodiments, such as those illustrated and FIGS. 1A-1C, the pwell 106 surrounds (and faces) all four lateral sides of the nwell 104. The pwell 106 is formed as a plurality of successively deeper second implanted regions with a deepest one of the second implanted regions having a second range defining a second well depth at which a maximum implanted p type dopant concentration occurs, where the second well depth is also greater than or equal to the isolation depth, and may be substantially the same depth 104D as that of the nwell 104. In addition, the pwell 106 is advantageously formed concurrently with other pwells of the dual well CMOS process.

Unlike conventional CMOS dual well configurations, moreover, the pwell 106 is laterally spaced from the first well 104 by a distance 110 to leave a well-free portion of the semiconductor substrate 102 extending laterally between the second well 106 and all or at least one side of the body region 104B of the first well 104. In this embodiment, moreover, both wells 104 and 106 have dopant concentrations higher than that of the well-free portion of the semiconductor substrate 102 extending between the wells 104 and 106. As seen in FIG. 1B, the lateral spacing 110 in this embodiment is generally maintained around all four sides of the nwell 104, although other spacing configurations may be used with variations in the spacing distance 110 around the lateral sides of the nwell 104. The lateral spacing 110 proximate the body region 104B in particular provides for advantageous control over breakdown voltage VB as well as voltage coefficient of resistivity VCR. In the illustrated embodiment, the pwell 106 is formed to approximately the same depth 104D as the nwell 104, although other embodiments are possible in which the wells 104 and 106 are formed to different depths. In addition, although the nwell 104 is shown as having a generally rectangular plan view shape (FIG. 1B), and the surrounding pwell 106 has a generally rectangular opening defining the well-free region of the substrate 102 between the wells 104 and 106, other shapes and combinations of shapes may be used for the diffusion resistor well 104 and the opening in the well 106.

While the illustrated IC 100 is formed in/on a P– substrate 102 with an nwell resistor 104 and surrounding P type well 106, other embodiments are possible using the complementary conductivity type combinations. For instance, integrated circuits are contemplated including pwell diffusion resistors laterally bounded by spaced nwells. Such alternate embodiments can be fabricated, for example, in N type substrates with a pwell forming the resistor body and head regions, and one or more laterally spaced nwells, leaving a well-free region of the N substrate extending along at least the body portion sides of the resistor well. Moreover, further embodiments are possible as illustrated and described below in connection with FIGS. 5A-7F in which a pwell diffusion resistor 103 is formed in a P type substrate 102 with a laterally surrounding nwell 206 along with an underlying deep nwell 205.

FIG. 2 shows a graph 140 with a well-well breakdown voltage (BV) curve 142 as a function of the well-well lateral spacing distance 110 in the diffusion resistor example of FIGS. 1A-1C. As seen in the graph 140, a nominal breakdown voltage of around 12 V is provided for very low biasing, and the curve 142 gradually increases from about 0.2 μm through about 2.0 μm at a breakdown voltage of about 35 V. Any further increase in the well-well spacing 110 provides little or no increase to the breakdown voltage. Thus, spacings of about 2.0 μm or less can be used in certain embodiments to provide a specific amount of breakdown voltage for a given design. In certain embodiments, spacings of about 0.2 μm or more are contemplated, and certain embodiments contemplate well-well spacing distances 110 of about 2.0 μm or less. For instance, if a given application requires a 15 V breakdown rating, a spacing distance 110 of about 0.5-0.8 μm can be used. Moreover, the inventors have contemplated that the spacing 110 can be tailored to provide improvement in the voltage coefficient of resistivity (VCR) for the diffusion resistor 101. Moreover, different curves 142 will be found for different processes and materials.

Compared with conventional diffusion resistors, the depletion under relatively high biasing between the wells 104 and 106 in the IC 100 occurs largely in the lightly doped well-free portion of the P– substrate 102 between the wells 104 and 106. Spacing the pwell 106 from the body side of the nwell 104 reduces lateral depletion of the well 104, and therefore more of the well 104 remains undepleted (conducting) even under high biasing, and therefore the VCR may be significantly reduced compared with conventional diffusion well resistors. In this regard, minimizing lateral depletion by spacing the wells 104 and 106 in the diffused well structure 104 effectively maintains the conduction width of the resistor 101 under increased biasing compared with conventional diffused resistors. As a result, the depletion under high biasing, if any, is predominantly from the bottom, and therefore has less of an effect on the resistance between the terminals 114, 116 at the top of the well 104 in the head regions 104H. Consequently, the diffusion resistor design 101 has a lower voltage coefficient of resistivity (less variation in resistance as a function of voltage). This novel approach, moreover, is an improvement over high voltage well structures (e.g., HVNWELL), as these use selective lower doping to increase breakdown voltage, but the lighter doping of the HVNWELL aggravates the lateral depletion, and therefore worsens the VCR. The disclosed designs, on the other hand, may be successfully employed to provide higher voltage breakdown in addition to reduction of VCR. Furthermore, these concepts maintain the advantages of size and current carrying capability over polysilicon resistor solutions.

Figure 4A:
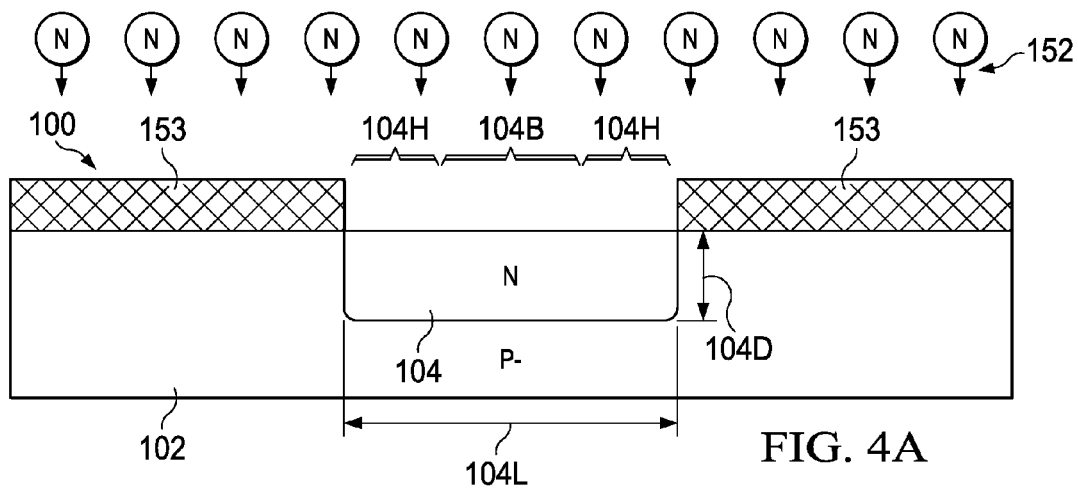
FIGS. 4A-4F are partial sectional side elevation views illustrating the integrated circuit of FIGS. 1A-1C, depicted in successive stages of fabrication.

Referring now to FIGS. 3 and 4A-4F, a process 150 is illustrated in FIG. 3 for fabricating an integrated circuit 100 with an improved diffusion resistor 101 as seen, for example, in FIGS. 1A-1C, and FIGS. 4A-4F show the integrated circuit 100 at various intermediate stages during fabrication. The process 150 begins at 152 with formation of the N type diffusion resistor well 104 in the P– substrate 102. The formation in one embodiment is shown in FIG. 4A, in which an implantation process 152 is performed using a photoresist or other form of implantation mask 153. The mask 153 and other masks illustrated and described hereinafter may be formed, patterned, used for selective implantations, and thereafter removed using any well-known materials and techniques, and the mask 153 is used to concurrently form other N type wells (not shown) in a dual well CMOS process. The mask 153 in this case covers a prospective well-free region of the substrate 102 outlying the lateral sides of the implanted nwell 104. As seen in the side view of FIG. 4A, moreover, the implanted well region 104 includes a central body region 104B as well as two outlying head regions 104H disposed on opposite longitudinal ends of the body region 104B. The implantation process 152 in certain embodiments provides a well 104 having a depth 104D of about 1.5 μm or less, although any suitable depth can be used. The implantation process 152 includes a plurality of successively deeper N type implantations (e.g., phosphorus in one embodiment) with a deepest one implantation having a range defining the first well depth (104D in FIG. 4A) at which a maximum implanted dopant concentration occurs, where the depth 104D is at least as deep or deeper than an isolation depth of shallow trench isolation (STI) or other isolation structures formed in the substrate 102, and the successively deeper series of N type implantations are concurrently used to form other nwells in the dual well CMOS process. In certain embodiments, for instance, the well depth 104D extends below the level of any shallow trench isolation (STI) trench bottoms (not shown). In one particular embodiment, a depth 104D of about 1.0-1.5 μm is provided by selecting the implantation energy of the process at 152 according to the implanted species. In another specific embodiment, a depth of approximately 0.7-0.8 μm is provided for the nwell 104. As seen in FIG. 4A, moreover, the implanted nwell 104 extends along a longitudinal length 104L and provides a well width 104W (FIGS. 1A and 1B above), which can be tailored according to a particular design with respect to current density, resistance, and/or any other resistor parameter. In one possible embodiment, multiple implants are performed at 152, each at a different energy level to form a different portion of the well 104, for example, with the deepest implant providing phosphorus or other N type dopants at an implant energy of around 300-350 kev. The implantation at 152 is performed at a dosage level sufficient to provide a dopant concentration within the well 104 which exceeds that of the surrounding substrate 102.

At 154 in FIG. 3, a surrounding, laterally spaced, P type well 106 is formed in the substrate 102 (FIG. 4B) by any suitable technique. In the illustrated example, a P type implantation process 154 is performed using a second photoresist or implantation mask 155, which exposes portions of the upper surface of the substrate 102 into which the well implants are to be provided, while covering both the nwell 104 and the laterally adjacent well-free region of the P− substrate 102. The implantation process 154 includes a series of two or more successively deeper second implantations, where a deepest of these implantation steps has a second range defining a second well depth at which a maximum implanted dopant concentration occurs, where the second well depth is also greater than or equal to the isolation depth, and may be substantially the same as the depth 104D of the first well 104. In addition, the implantation process 154 is also used to concurrently form other pwells of the dual well CMOS process in fabricating the integrated circuit 100. Suitable mask formation, patterning, and removal processing steps can be used, and one or more annealing operations can be performed for activating the implanted dopants in this and other described implantation processes.

Figure 4B:
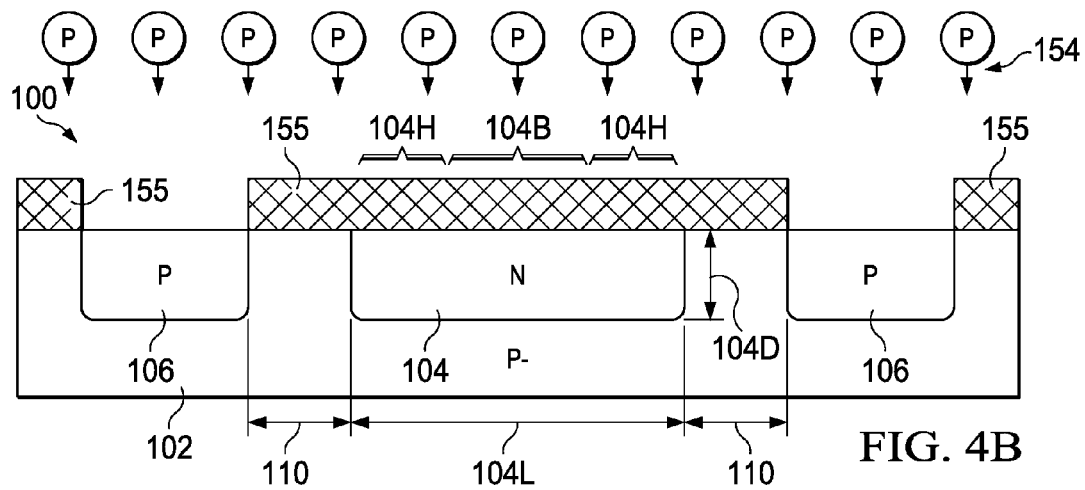

Unlike conventional CMOS dual well processes, the first mask 153 in FIG. 4A and the second mask 155 used in FIG. 4B are not strictly complementary, and instead, both mask 153 and mask 155 cover the prospective well-free region so that the resulting wells 104 and 106 are spaced from one another by a lateral spacing distance 110 as shown in FIG. 4B. The P type implantation process 154 can use any suitable P type dopants, such as boron. In one particular implementation, two or three boron implants are performed at successively shallower depths, with the deepest implant 154 using an energy of approximately 200-250 kev, where the implants 154 provide sufficient dopant dosage such that the resulting pwell 106 has a dopant concentration exceeding that of the P− substrate 102. Moreover, any suitable well depth can be used for the pwell 106 that is at least as deep or deeper than the STI isolation depth, which may be the same, or which may be different from the nwell depth 104D. Suitable mask formation, patterning, and removal processing steps can be used, and one or more annealing operations can be performed for activating the implanted dopants.

At 156 in FIG. 3, N+ regions 112 are formed in all or parts of the laterally spaced head regions of the well 104, for example, using an implantation process 156 (FIG. 4C) and a corresponding implantation mask 157. In this regard, the N+ regions 112 provide a highly doped area for subsequent formation of an electrical contact for the two head ends 104H of the diffusion resistor 101. As further seen in FIG. 4D, silicide 114 is formed (158 in FIG. 3) above all or portions of the head contact regions 104H of the well 104 by any suitable silicide formation techniques. In one possible implementation, a nitride mask is formed and patterned to expose portions of the head contact regions 104H, and cobalt or other suitable metal is deposited so as to contact the implanted regions 112 of the substrate. The IC 100 is then heated (e.g., 800-900°) to react the silicon with the deposited metal to form the silicide 114, to a thickness of about several hundred angstroms in one possible implementation. As seen in FIGS. 4E and 4F, metallization processing is then performed at 160, including formation of a thick oxide interlayer dielectric 108 (FIG. 4E) and metal contacts 116A and 116B are formed (FIG. 4F) to electrically connect with the silicide 114 and the implanted portions 112 of the head regions 104H of the resistor well 104. Thus, two electrical connections are made to the ends of the resulting diffusion resistor 101, and further metallization layers (not shown) can be used to form circuit connections to the resistor contacts 116.

Figure 5A:
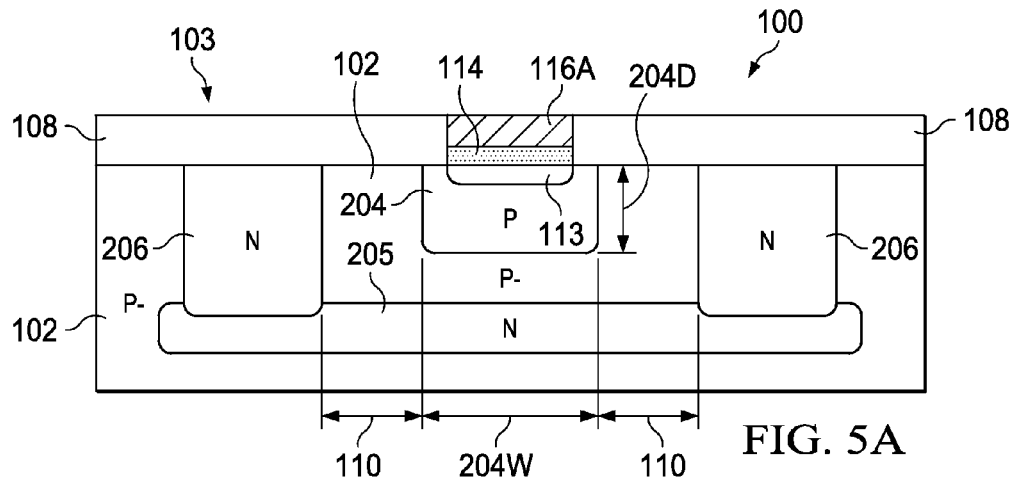
FIGS. 5A and 5B are partial sectional elevation views illustrating an integrated circuit with a pwell diffusion resistor formed above a deep nwell in a P− semiconductor substrate and surrounded by a spaced nwell.
Figure 5B:
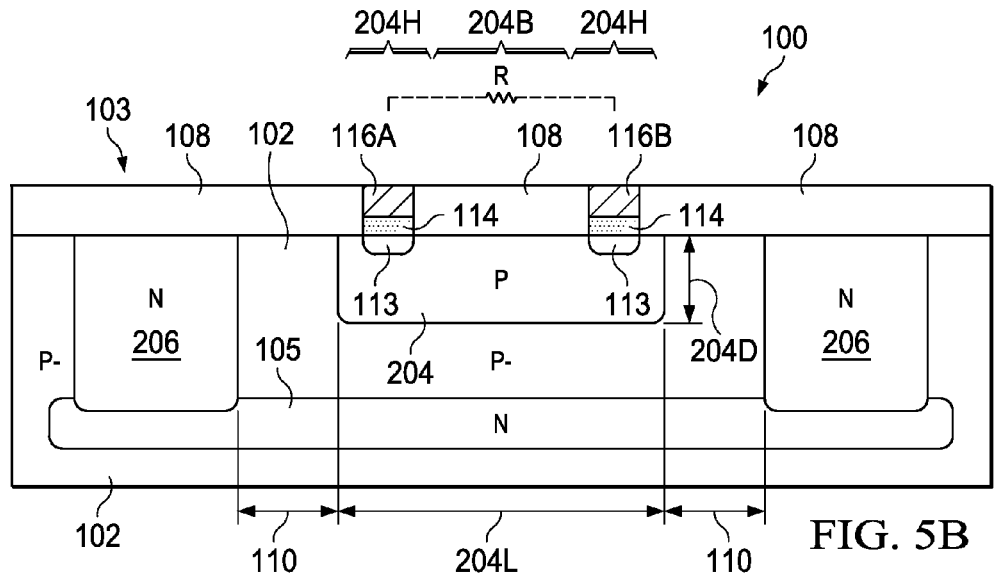

Referring now to FIGS. 5A-7F, FIGS. 5A and 5B illustrate end and side sectional views of another integrated circuit embodiment 100, including a pwell type diffusion resistor 103 formed using a pwell 204 formed to a depth 204D greater than or equal to an isolation depth of STI or other isolation structures, with the well 204 including a body 204B and two head regions 204H disposed in a P− substrate 102. In addition, the IC 100 includes one or more laterally spaced nwells 206 and an underlying (vertically spaced) deep nwell 205. As in the above embodiment, the IC 100 is built via a dual well CMOS process using a P− substrate 102, with this embodiment also including a deep nwell 205 formed within the substrate 102. The nwell 206 is formed as a plurality of successively deeper implementations laterally spaced from and surrounding the pwell 204, with the deepest of these implanted regions having a range defining the well depth at which a maximum implanted dopant concentration occurs, where the depth of the well 206 is deeper than an upper depth of the deep nwell 205. Similarly, the nwell 206 includes a series of two or more successively deeper implanted regions, a deepest of which having a range defining a corresponding well depth at which the maximum implanted dopants concentration occurs. In certain embodiments, the second well 206 is formed laterally proximate to (e.g., facing but spaced from) at least one lateral side of the body region 204B of the pwell 204, and other embodiments are possible (e.g., FIGS. 5A and 5B) in which the sinker well 206 surrounds (and faces) all four lateral sides of the pwell 204. The pwell 204 has a depth 204D as well as a width 204W (FIG. 5A) and a length 204L (FIG. 5B). Different designs are possible in which the length 204L and the width 104W are designed according to the desired resistance value R, and the depth 204D is at least as deep as the isolation depth of the IC 100, and in certain embodiments is about 1.5 μm or less, such as about 1.0-1.5 μm in one specific embodiment, and about 0.7-0.8 μm in another particular embodiment. The lateral well-well spacing distance 110 in certain embodiments is set according to the curve 142 in FIG. 2 above, or according to a similar curve, such as about 2.0 μm or less in some embodiments, and about 0.2 μm or more in certain embodiments.

The bottom of the pwell 204 is spaced from the deep nwell 205 in the embodiment of FIGS. 5A and 5B, whereby the pwell 204 is laterally and vertically bounded by lightly doped P− substrate material 102. In this regard, the P− substrate material 102 in the well-free region between the well 204 and the surrounding well 206 has a dopant concentration less than that of either of the wells 204, 206. Like the above embodiment, moreover, contact structures 114, 116 are provided for electrical contact to the head regions 204H disposed at laterally opposite sides of the resistor body region 204B. In this embodiment, moreover, P+ implants 113 are provided in the resistor head regions 204 H for low impedance connection to the silicide 114 and overlying metal contact 116. The resulting diffusion resistor 103 in FIGS. 5A and 5B has the same advantages as the nwell type diffusion resistor 101 in FIGS. 1A-1C, including increased breakdown voltage (BV) and reduced voltage coefficient of resistivity (VCR) relative to conventional diffusion resistors due at least in part to the lateral spacing distance 110.

Figure 6:
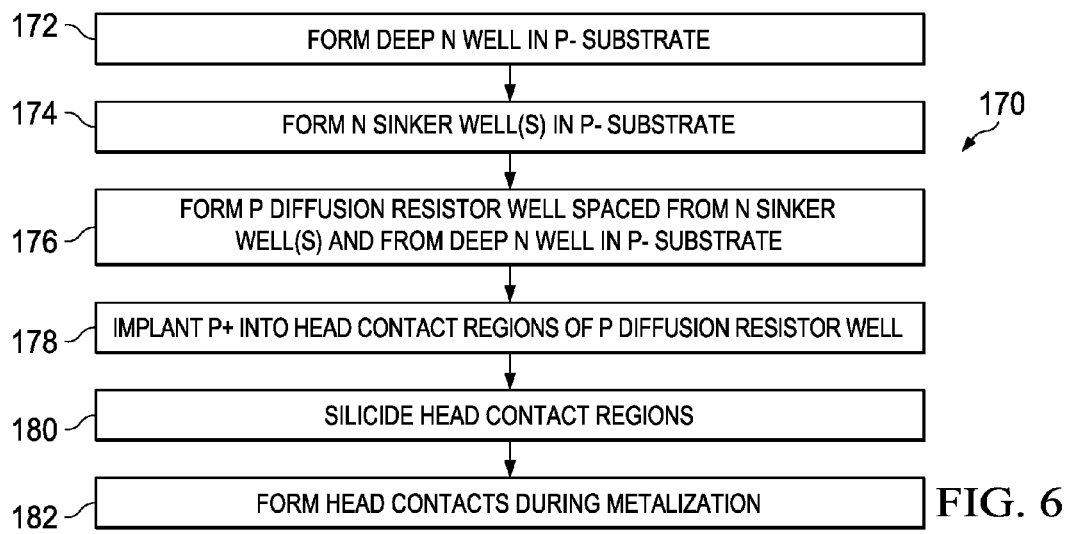
FIG. 6 is a flow diagram illustrating a method for fabricating the integrated circuit with the pwell diffusion resistor of FIGS. 5A and 5B.
Figure 7A:
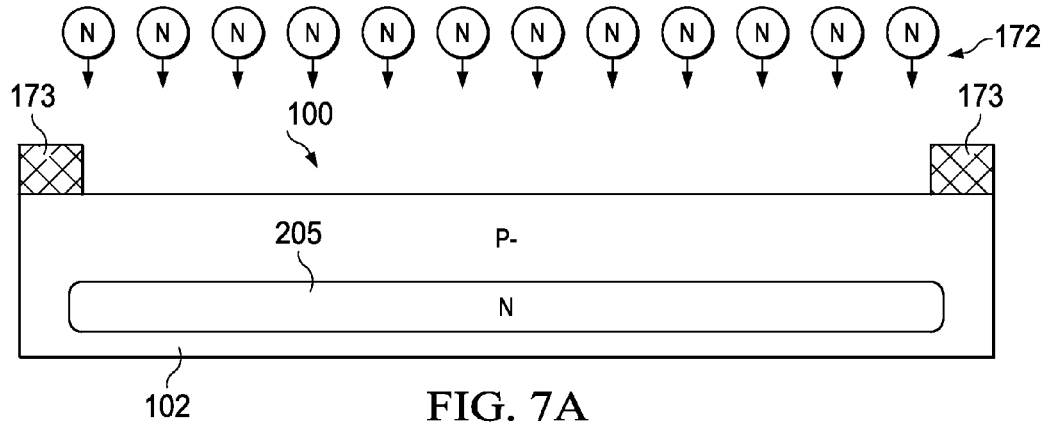
FIGS. 7A-7F are partial sectional side elevation views showing the integrated circuit of FIGS. 5A and 5B in successive stages of fabrication.

FIG. 6 illustrates a process 170 for fabricating an integrated circuit 100 having a diffused well resistor 103 as exemplified in FIGS. 5A and 5B, and FIGS. 7A-7F show the integrated circuit 100 at various intermediate stages of fabrication. At 172 in FIG. 6, a deep nwell is formed in a P− substrate, where the deep nwell can be formed using any suitable deep well formation processing. As seen in FIG. 7A, the deep nwell 205 in one example is formed in the P− substrate 102 via an implantation process 172 using a first implantation mask 173, such as patterned photoresist. Any suitable P type dopant dosage and implantation energy can be used, for example, boron implantation at a suitable energy to provide the well 205 at a relatively deep region within the P− substrate 102. Moreover, the deep nwell well 205 is preferably formed such that the upper boundary of the well 205 is spaced from the bottom of a prospective pwell 204 (e.g., as seen in FIGS. 5A and 5B).

Figure 7B:
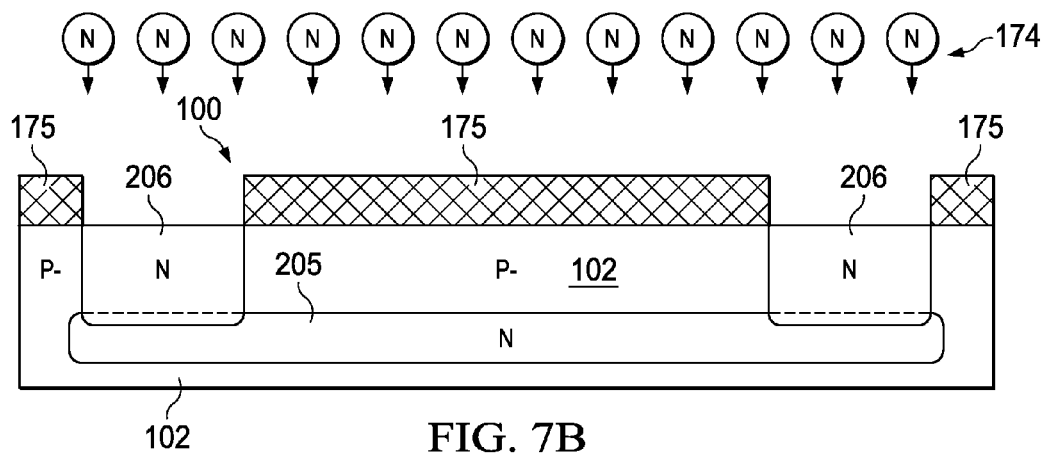

One or more sinker nwells 206 are formed at 174, as seen in FIG. 7B, for example, using an N type implantation process 174 and an implant mask 175. As in the above embodiments, the implant mask 175 for the nwell 206 is formed so as to cover the prospective pwell diffusion region 204 as well as a prospective well-free region of the substrate 102, where the implantation mask 175 may be similarly constructed as the mask 155 used for the P type implant in the embodiment of FIG. 4B above. The nwell 206 is termed a "sinker" as it is formed to a depth commensurate with at least a top portion of the deep nwell 205 as shown in FIG. 7B, where the depth of the well 206 is greater than the isolation depth. In addition, certain embodiments are contemplated in which the sinker nwell 206 is formed at 174 so as to extend all the way around (and spaced from by lateral spacing distance 110) the prospective pwell, and the deep nwell 205 contacts the sinker nwell 206 and completely underlies the prospective pwell region 204. Any suitable well formation techniques can be used at 174, such as implantation of one or more N type dopants (e.g., phosphorus, etc.) using the mask 175 in a series of successively deeper implantations, where the deepest N type implantation has a range defining the well depth at which the maximum implanted dopant concentration occurs. Moreover, the implantation dosage in the process 174 is sufficient to provide a dopant concentration within the nwell 206 which exceeds the doping concentration of the surrounding substrate 102. The implant energy may be similar to or higher than those used in forming other nwells in the CMOS process to achieve the sinker well depth to the deep nwell 205, and multiple implants are employed at successively greater depths to create the sinker nwell 206. The implantation at 152 is performed at a dosage level sufficient to provide a dopant concentration within the well 206 which exceeds a dopant concentration of the surrounding substrate 102.

Figure 7C:
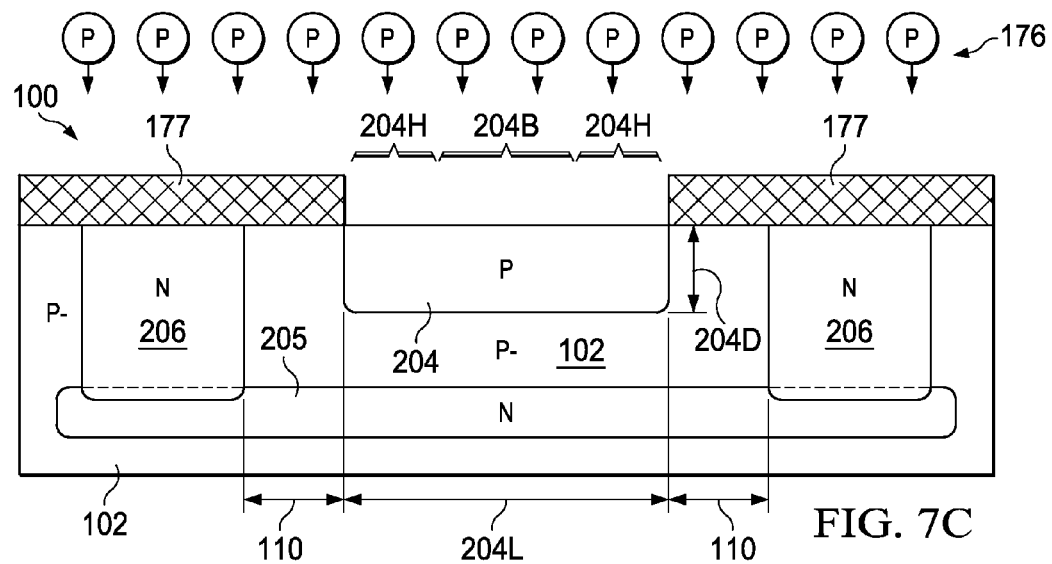

Referring also to FIG. 7C, a P type diffusion resistor well 204 is formed at 176, which is spaced from the sinker nwell 206 by the lateral spacing distance 110, and the pwell 204 is also vertically spaced from the deep nwell 205. The pwell 204 can be formed at 176 using any suitable diffusion well formation processing, where FIG. 7C illustrates an exemplary implantation technique 176 using a mask 177. The implantation step 176 includes a plurality of P type implantations at successively greater depths, where the deepest implantation 176 has a range finding the corresponding depth of the well 204 at which the maximum implanted dopant concentration occurs, where the well depth of the pwell 204 is at least as deep as the isolation depth of STI or other isolation structures formed in the IC 100. The mask 177 used for implanting the well 204 is also concurrently used to form other wells in the dual well CMOS process, and includes an opening allowing implantation of a P type dopants (e.g., boron in one example) having a well length 204L and a width 204W (FIG. 5A). In this regard, the mask 177 may be constructed similar to the mask 153 shown in FIG. 4A above, and provides an opening defining a body region 204B and two laterally oppositely disposed well head regions 204H along the length 204L, while covering a well-free region of the substrate 102 between the lateral sides of the well 204 and the sinker nwell 206 as seen in FIG. 7C. The implantation 176 employs an energy level sufficient to create the well 204 to a depth 204D, such as about 1 μm in certain embodiments, although any suitable depth 204D can be used which remains above the top side of the deep nwell 205. In one example, the pwell well 204 is implanted to a depth 204D of about 1.5 μm or less, such as about 1-1.5 μm in one embodiment, or about 0.7-0.8 μm in another embodiment. The implantation dosage level used in the implantation process 176, moreover, can be any suitable level which provides a dopant concentration in the well 204 greater than a dopant concentration of the well-free region of the P− substrate 102.

Figure 4C:
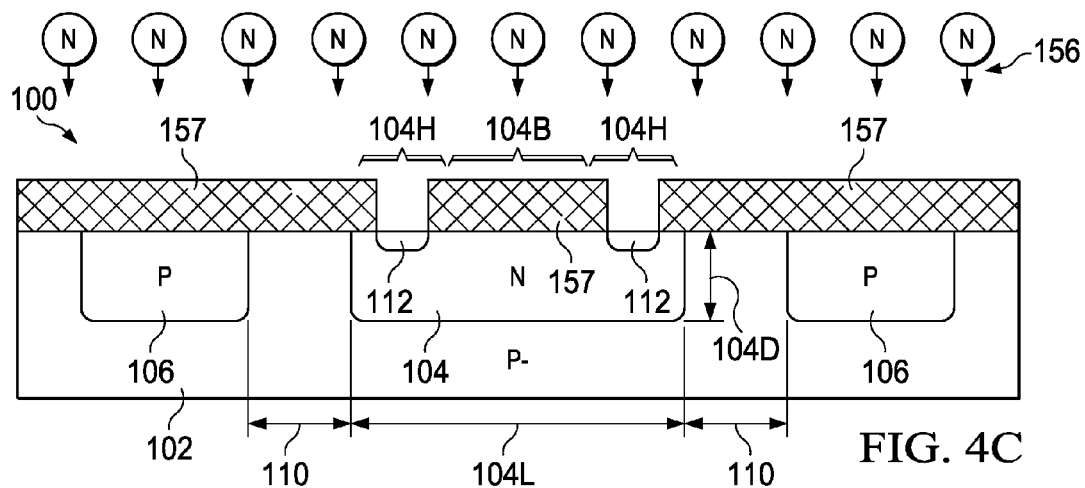
Figure 4D:
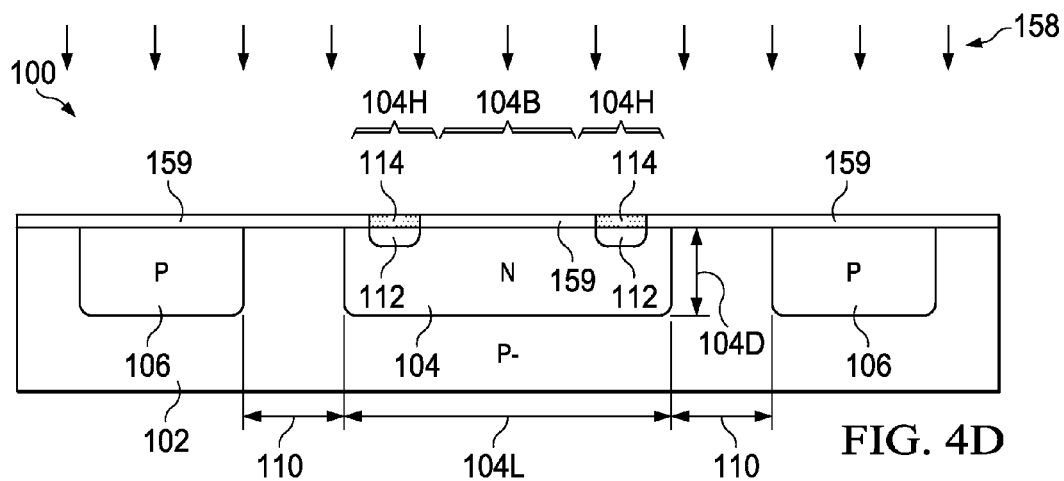
Figure 4E:
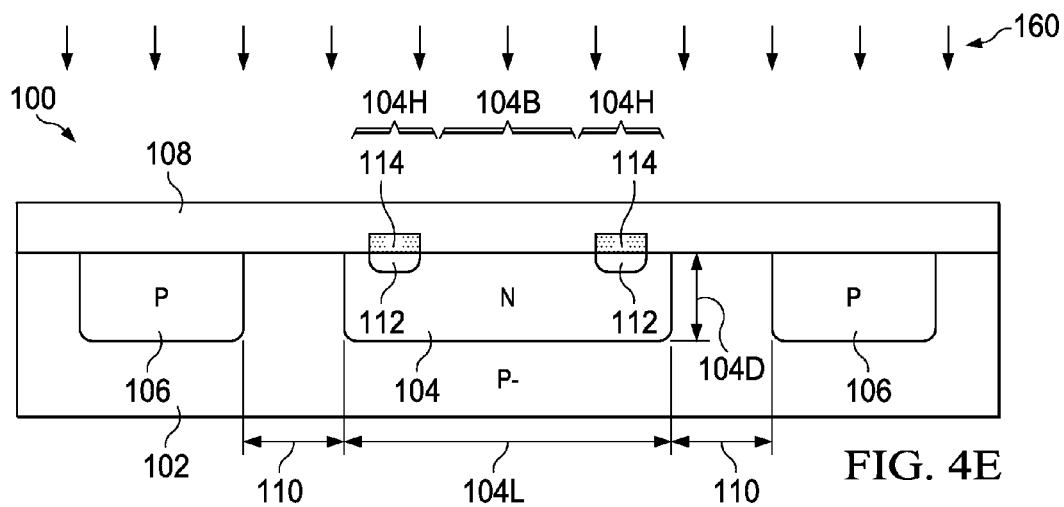
Figure 4F:
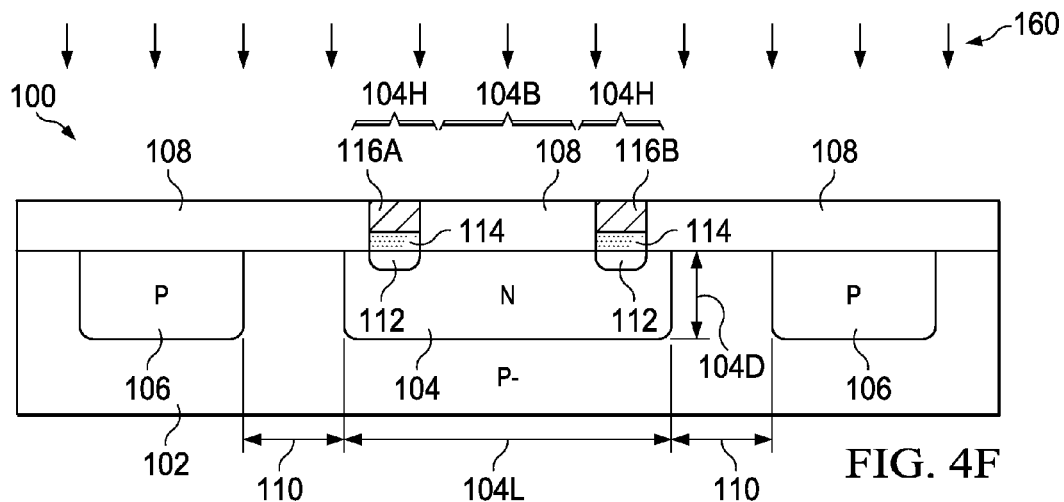
Figure 7D:
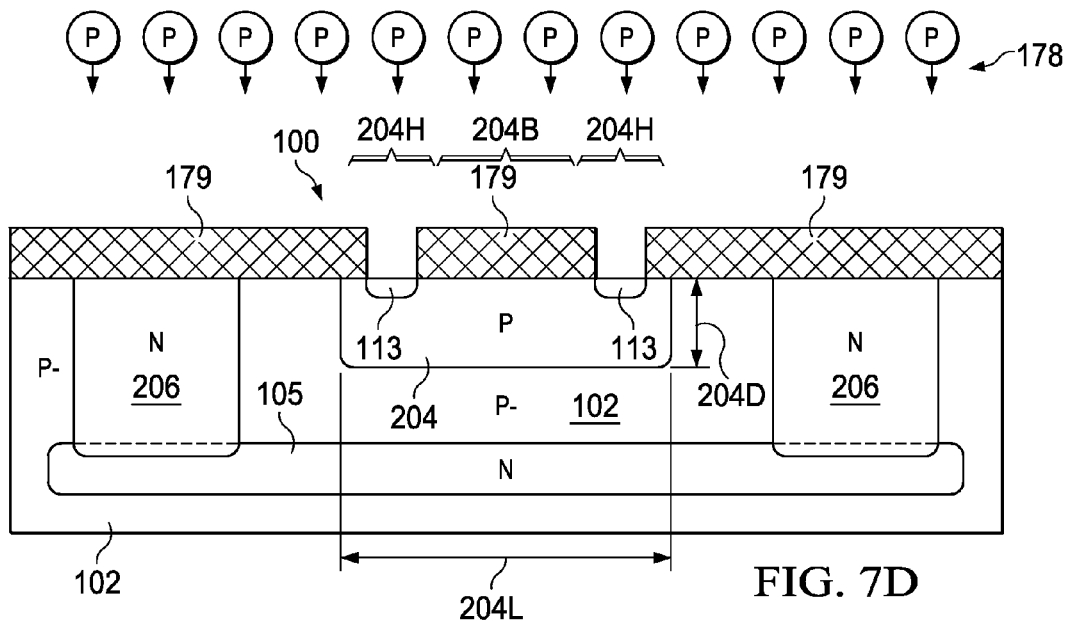
Figure 7E:
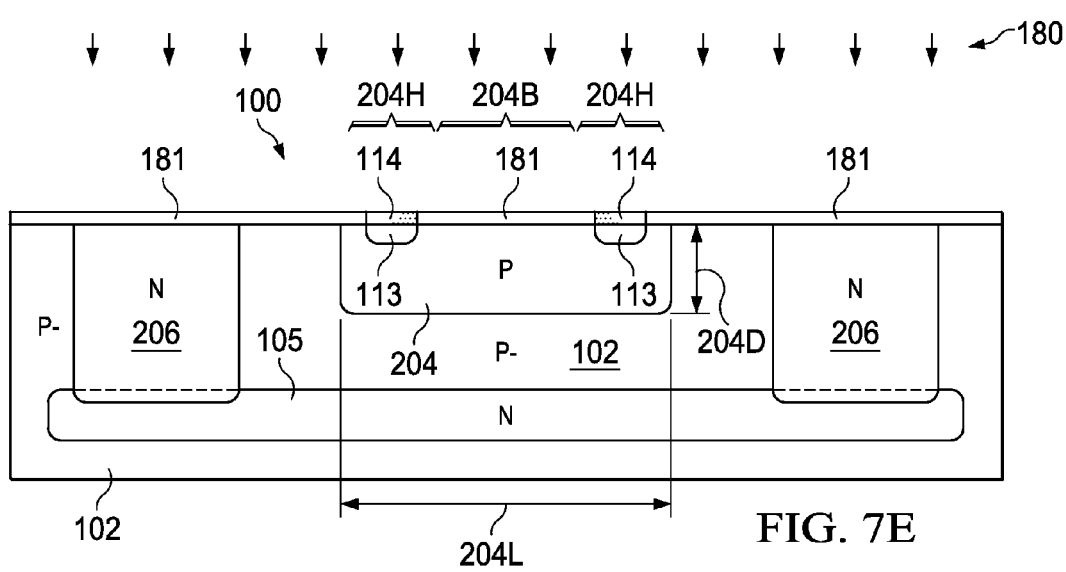
Figure 7F:
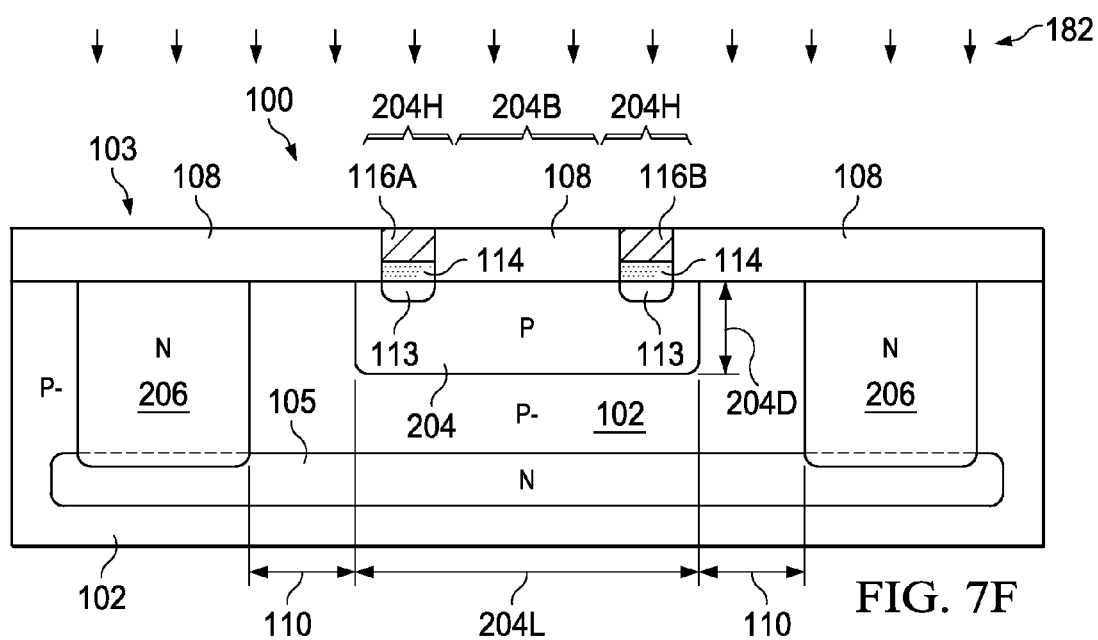

At 178 in FIG. 6, P+ dopants are implanted into all or portions of the head regions 204H of the well 204 to form P+ regions 113 shown in FIG. 7D, for example, using an implantation process 178 and a mask 179 (e.g., similar to the N+ implant mask 157 in FIG. 4C above). At 180, silicide head contact regions 114 are formed above the P+ regions 113. FIG. 7E illustrates exemplary silicide formation processing 180 using a nitride mask 181 by which silicide 114 is formed only in the designated regions above the implants 113, where the processing 180 may be similar to the silicide formation described above in connection with FIG. 4D. FIG. 7F illustrates metallization processing at 182 including formation of a thick oxide layer 108 and metal contacts 116A and 116B for connection to the head regions of the P type diffusion resistor well 204.

The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been disclosed with respect to only one of multiple implementations, such feature may be combined with one or more other features of other embodiments as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

What is claimed is:

1. An integrated circuit, comprising:
 a semiconductor substrate;
 a first well comprising a plurality of successively deeper first implanted regions of one conductivity type disposed in the semiconductor substrate, with a deepest one of the first implanted regions having a first range defining a first well depth at which a maximum implanted dopant concentration occurs, the first well depth being greater than or equal to an isolation depth of shallow trench isolation structures formed in the semiconductor substrate, the first well comprising a body region, and first and second head regions disposed at opposite ends of the body region;

at least one second well comprising a plurality of successively deeper second implanted regions of a different conductivity type disposed in the semiconductor substrate, with a deepest one of the second implanted regions having a second range defining a second well depth at which a maximum implanted dopant concentration occurs, the second well depth being greater than or equal to the isolation depth, the second well being spaced laterally from the first well by a lateral spacing distance and facing at least one lateral side of the body region of the first well with a well-free portion of the semiconductor substrate extending laterally between the second well and the body region of the first well, the well-free portion of the semiconductor substrate having a dopant concentration lower than the second well and lower than the body region of the first well; and first and second contact structures individually connected to the first and second head regions of the first well.

2. The integrated circuit of claim 1, wherein the semiconductor substrate and the second well are both of a first conductivity type, and the first well is of a second conductivity type.

3. The integrated circuit of claim 2, the semiconductor substrate and the second well are P type, and the first well is N type, and wherein the semiconductor substrate has a dopant concentration lower than the second well and lower than the body region of the first well.

4. The integrated circuit of claim 1, wherein the semiconductor substrate and the first well are of a first conductivity type, and the second well is of a second conductivity type.

5. The integrated circuit of claim 4, comprising a deep well of the second conductivity type disposed in the semiconductor substrate beneath the first well with a second well-free portion of the semiconductor substrate extending vertically between a bottom of the first well and a top of the deep well, wherein the at least one second well extends between an upper surface of the semiconductor substrate and at least a portion of the deep well.

6. The integrated circuit of claim 5, wherein the first conductivity type is P type, and wherein the second conductivity type is N type.

7. The integrated circuit of claim 1, wherein the first well has a depth of about 1.5 µm or less.

8. The integrated circuit of claim 1, wherein the lateral spacing distance is about 0.2 µm or more.

9. The integrated circuit of claim 8, wherein the lateral spacing distance is about 2.0 µm or less.

10. The integrated circuit of claim 1, wherein the lateral spacing distance is about 2.0 µm or less.

* * * * *